United States Patent
Yu

(10) Patent No.: US 11,990,432 B2
(45) Date of Patent: May 21, 2024

(54) SEMICONDUCTOR PACKAGING METHOD AND SEMICONDUCTOR PACKAGE DEVICE

(71) Applicant: TONGFU MICROELECTRONICS CO., LTD., Nantong (CN)

(72) Inventor: Guoqing Yu, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 301 days.

(21) Appl. No.: 17/317,376

(22) Filed: May 11, 2021

(65) Prior Publication Data
US 2021/0265294 A1    Aug. 26, 2021

Related U.S. Application Data

(63) Continuation of application No. PCT/CN2019/082310, filed on Apr. 11, 2019.

(30) Foreign Application Priority Data

Nov. 12, 2018   (CN) .......................... 201811341230.9
Nov. 12, 2018   (CN) .......................... 201811341282.6
Nov. 12, 2018   (CN) .......................... 201811341984.4

(51) Int. Cl.
*H01L 23/00*    (2006.01)
*H01L 21/78*    (2006.01)

(52) U.S. Cl.
CPC .............. *H01L 24/05* (2013.01); *H01L 21/78* (2013.01); *H01L 24/03* (2013.01);
(Continued)

(58) Field of Classification Search
CPC ........... H01L 27/1462; H01L 27/14618; H01L 27/14632; H01L 27/14636; H01L 27/14685; H01L 27/14687
See application file for complete search history.

(56) References Cited

U.S. PATENT DOCUMENTS

2008/0203511 A1    8/2008   Huang et al.
2008/0309805 A1    12/2008  Chan
(Continued)

FOREIGN PATENT DOCUMENTS

CN    101814445 A    8/2010
CN    101950751 A    1/2011
(Continued)

OTHER PUBLICATIONS

World Intellectual Property Organization (WIPO) International Search Report for PCT/CN2019/082310 dated Aug. 6, 2019 5 Pages.

*Primary Examiner* — Thanh T Nguyen
(74) *Attorney, Agent, or Firm* — Anova Law Group, PLLC

(57) ABSTRACT

The present disclosure provides a semiconductor packaging method and a semiconductor package device. The method includes providing a chip, where the chip includes a chip substrate having a front surface and a back surface; soldering pads disposed at the front surface of a chip substrate surrounding the photosensitive region; a metal part formed on a side of each soldering pad facing away from the chip substrate; and a transparent protective layer formed on the front surface of the chip substrate. A first end of the metal part away from a corresponding soldering pad is in coplanar with the transparent protective layer; and the first end of the metal part is not covered by the transparent protective layer. The method further includes electrically connecting the first end of the metal part to a circuit board using a conductive connection part to electrically connect the chip with the circuit board.

10 Claims, 4 Drawing Sheets

(52) U.S. Cl.
CPC ............... *H01L 2224/03462* (2013.01); *H01L 2224/04042* (2013.01); *H01L 2224/05022* (2013.01); *H01L 2224/05026* (2013.01); *H01L 2224/05118* (2013.01); *H01L 2224/05147* (2013.01); *H01L 2224/05155* (2013.01); *H01L 2224/05171* (2013.01); *H01L 2224/05568* (2013.01)

(56) References Cited

U.S. PATENT DOCUMENTS

| | | | |
|---|---|---|---|
| 2014/0332908 A1* | 11/2014 | Ho | H01L 24/05 438/48 |
| 2017/0147857 A1* | 5/2017 | Liu | H01L 24/46 |
| 2018/0121705 A1* | 5/2018 | Oganesian | G06V 40/1318 |

FOREIGN PATENT DOCUMENTS

| | | |
|---|---|---|
| CN | 109390364 A | 2/2019 |
| CN | 109390365 A | 2/2019 |

* cited by examiner

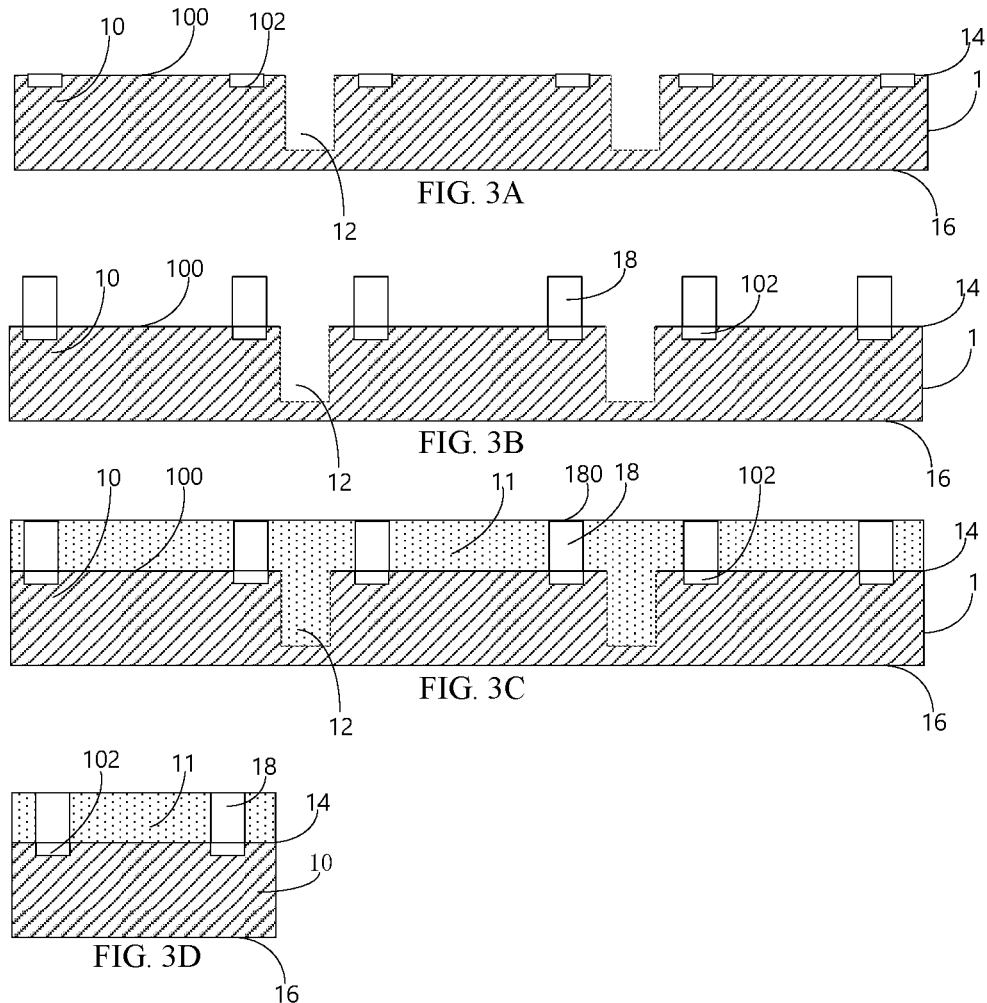
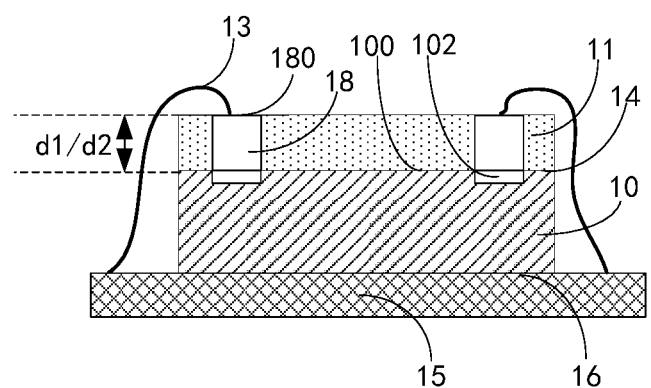
FIG. 4

SEMICONDUCTOR PACKAGING METHOD AND SEMICONDUCTOR PACKAGE DEVICE

CROSS-REFERENCE TO RELATED APPLICATIONS

This application is a continuation application of PCT Patent Application No. PCT/CN2019/082310, filed on Apr. 11, 2019, which claims the priority of Chinese patent application No. 201811341230.9, filed on Nov. 12, 2018, No. 201811341282.6, filed on Nov. 12, 2018, and No. 201811341984.4, filed on Nov. 12, 2018, the entirety of all of which is incorporated herein by reference.

TECHNICAL FIELD

The present disclosure generally relates to the field of semiconductor technology and, more particularly, relates to a semiconductor packaging method and a semiconductor package device.

BACKGROUND

The chip with a photosensitive region is an extremely important part of camera equipment. In order to protect the photosensitive region of the chip, a commonly used packaging method may include adding a transparent glass cover above the photosensitive region of the chip, thereby protecting the photosensitive region of the chip.

The inventors of the present application has discovered that, on the one hand, since the thickness of the transparent glass cover is thick, refraction, reflection, energy loss and the like may occur when light passes through the transparent glass, which make the photosensitive effect of the chip not desirable; on the other hand, the transparent glass cover and the chip may be connected by an adhesive, the adhesive may be easy to be detached after a long period of use, and outside dust may easily enter the photosensitive region of the chip, thereby affecting the photosensitive effect of the chip.

SUMMARY

One aspect of the present disclosure includes a semiconductor packaging method. The method includes providing a chip, where the chip includes a chip substrate having a front surface and a back surface, where the front surface includes a photosensitive region; soldering pads disposed at the front surface of the chip substrate surrounding the photosensitive region; a metal part formed on a side of each soldering pad facing away from the chip substrate; and a transparent protective layer formed on the front surface of the chip substrate, where a first end of the metal part away from a corresponding soldering pad is in coplanar with the transparent protective layer; and the first end of the metal part is not covered by the transparent protective layer; and further includes electrically connecting the first end of the metal part to a circuit board using a conductive connection part to electrically connect the chip with the circuit board.

Optionally, providing the chip includes providing a wafer, where the wafer includes a plurality of chip substrates arranged in a matrix and separated by dicing grooves between adjacent chip substrates, and the soldering pads are formed at the front surface of each chip substrate and surrounding a corresponding photosensitive region of each chip substrate; forming the metal part on each soldering pad facing away from the chip substrate; forming the transparent protective layer on the front surface of the chip substrate, where the transparent protective layer covers the photosensitive region and the metal part; polishing a side of the transparent protective layer away from the chip substrate to expose the metal part; and performing a cutting process along the dicing grooves of the wafer, thereby removing a portion of the wafer and a portion of the transparent protective layer that correspond to the dicing grooves to provide a plurality of single chips.

Optionally, forming the transparent protective layer on the front surface of the chip substrate includes forming the transparent protective layer on the front surface of the chip substrate by spin coating, dispensing or printing a material, and solidifying the material for the transparent protective layer.

Optionally, solidifying the material for the transparent protective layer includes solidifying the material for the transparent protective layer using ultraviolet irradiation or high-temperature baking.

Optionally, forming the transparent protective layer on the front surface of the chip substrate, where the transparent protective layer covers the photosensitive region and the metal part; the first end of the metal part away from the corresponding soldering pad is in coplanar with the transparent protective layer; and the first end of the metal part is not covered by the transparent protective layer, includes: forming the transparent protective layer on the front surface of the chip substrate, where the transparent protective layer covers a surface of the first end of the metal part; and polishing the side of the transparent protective layer away from the chip substrate to expose the surface of the first end of the metal part.

Optionally, electrically connecting the first end of the metal part to the circuit board using the conductive connection part includes using a wire to electrically connect the first end of the metal part with the circuit board.

Optionally, electrically connecting the first end of the metal part to the circuit board using the conductive connection part includes using a conductive folded plate to electrically connect the first end of the metal part with the circuit board.

Optionally, the conductive folded plate includes a first portion and a second portion, where the first portion is in parallel with the front surface of the chip substrate; the second portion is in parallel with a sidewall of the chip and disposed in a close proximity to the sidewall of the chip; the first portion is electrically connected to the first end of the metal part; and a side of the second portion facing toward the circuit board is electrically connected to the circuit board.

Optionally, the conductive folded plate includes a first portion, a second portion, and a third portion, where the first portion is connected to the third portion through the second portion; the first portion is in parallel with the front surface of the chip substrate; the second portion is in parallel with a sidewall of the chip and disposed in a close proximity to the sidewall of the chip; the third portion extends along a direction away from the chip; the third portion is in parallel with a surface of the circuit board; the first portion is electrically connected to the first end of the metal part; and a side of the third portion facing toward the circuit board is electrically connected to the circuit board.

Optionally, before using the conductive folded plate to electrically connect the first end of the metal part with the circuit board, the method further includes using an adhesive film to fix the back surface of the chip substrate with the circuit board.

Another aspect of the present disclosure includes a semiconductor package device. The package device includes a chip, where the chip includes a chip substrate having a front surface and a back surface, where the front surface includes a photosensitive region; soldering pads disposed at the front surface of the chip substrate surrounding the photosensitive region; a metal part formed on a side of each soldering pad facing away from the chip substrate; and a transparent protective layer formed on the front surface of the chip substrate, where the transparent protective layer covers the photosensitive region of the chip substrate; a first end of the metal part away from a corresponding soldering pad is in coplanar with the transparent protective layer; and the first end of the metal part is not covered by the transparent protective layer; and further includes a circuit board, on the back surface of the chip substrate; and a conductive connection part, which electrically connects a surface of the first end of the metal part, exposed by protruding over a surface of the transparent protective layer, to the circuit board, where the chip and the circuit board are electrically connected with each other.

Optionally, the transparent protective layer is formed by spin coating, dispensing, or printing a material.

Optionally, the transparent protective layer is a material after solidifying the material for the transparent protective layer using ultraviolet irradiation or high-temperature baking.

Optionally, the conductive connection part is a wire.

Optionally, the conductive connection part is a conductive folded plate, and the conductive folded plate includes a first portion and a second portion, where the first portion is in parallel with the front surface of the chip substrate; the second portion is in parallel with a sidewall of the chip and disposed in a close proximity to the sidewall of the chip; the first portion is electrically connected to the first end of the metal part; and a side of the second portion facing toward the circuit board is electrically connected to the circuit board.

Optionally, the conductive connection part is a conductive folded plate, and the conductive folded plate includes a first portion, a second portion, and a third portion, where the first portion is connected to the third portion through the second portion; the first portion is in parallel with the front surface of the chip substrate; the second portion is in parallel with a sidewall of the chip and disposed in a close proximity to the sidewall of the chip; the third portion extends along a direction away from the chip; the third portion is in parallel with a surface of the circuit board; the first portion is electrically connected to the first end of the metal part; and a side of the third portion facing toward the circuit board is electrically connected to the circuit board.

Optionally, the conductive folded plate is made of an all-metal material or a material including a metal material and an insulation material surrounding the metal material.

Optionally, the conductive folded plate is made of an all-metal material or a material including a metal material and an insulation material surrounding the metal material.

Optionally, the metal part is a protruded metal column.

Optionally, the device further includes an adhesive film, between the back surface of the chip substrate and the circuit board.

Other aspects of the present disclosure can be understood by those skilled in the art in light of the description, the claims, and the drawings of the present disclosure.

BRIEF DESCRIPTION OF THE DRAWINGS

In order to clearly explain the technical solutions in various embodiments of the present disclosure or the existing technology, the drawings that need to be used in the description of various embodiments or the existing technology are illustrated hereinafter. Obviously, the drawings in the following description are merely some embodiments of the present disclosure. For those skilled in the art, other drawings can be obtained based on such drawings without creative work.

FIGS. 3A-3D illustrate structural schematics of an exemplary package device corresponding to S201-S204 in FIG. 2 according to various embodiments of the present disclosure;

FIG. 4 illustrates a structural schematic of an exemplary package device according to various embodiments of the present disclosure;

DETAILED DESCRIPTION

The technical solutions in various embodiments of the present application may be clearly and completely described in conjunction with the drawings in various embodiments of the present application hereinafter. Obviously, the described embodiments may only be a part of various embodiments of the present application, rather than all of various embodiments. Based on various embodiments in the present application, all other embodiments obtained by those skilled in the art without creative work should fall within the protection scope of the present application.

The present disclosure provides a semiconductor packaging method and a semiconductor package device. The method includes providing a chip, where the chip includes a chip substrate having a front surface and a back surface; soldering pads disposed at the front surface of a chip substrate surrounding the photosensitive region; a metal part formed on a side of each soldering pad facing away from the chip substrate; and a transparent protective layer formed on the front surface of the chip substrate. A first end of the metal part away from a corresponding soldering pad is in coplanar with the transparent protective layer; and the first end of the metal part is not covered by the transparent protective layer. The method further includes electrically connecting the first end of the metal part to a circuit board using a conductive connection part to electrically connect the chip with the circuit board.

Figure 1:
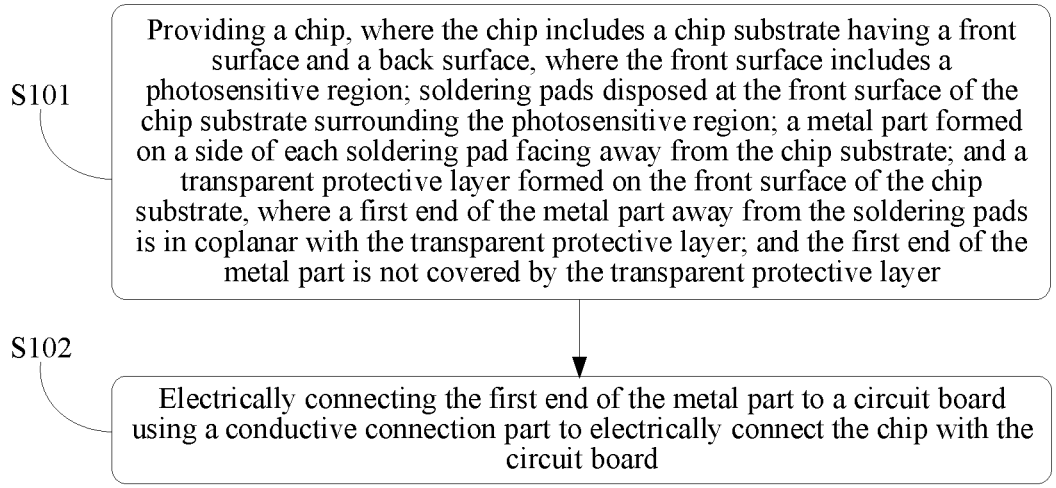
FIG. 1 illustrates a schematic flowchart of an exemplary packaging method according to various embodiments of the present disclosure.

Referring to FIG. 1, FIG. 1 illustrates a schematic flowchart of an exemplary packaging method according to various embodiments of the present disclosure. The packaging method may include the following exemplary steps.

In S101, a chip may be provided, where the chip may include a chip substrate having a front surface and a back surface, where the front surface includes a photosensitive region; soldering pads disposed at the front surface of the chip substrate surrounding the photosensitive region; a metal part formed on a side of each soldering pad facing away from the chip substrate; and a transparent protective layer formed on the front surface of the chip substrate. A first end of the metal part away from the soldering pad may be in coplanar with the transparent protective layer; and the first end of the metal part may not be covered by the transparent protective layer.

For example, the photosensitive region of the chip is an important part of the semiconductor package device; and if the photosensitive region is exposed, outside particles may easily pollute the photosensitive region and affect the imaging effect of the photosensitive region. Therefore, it is necessary to protect the photosensitive region of the chip.

Figure 2:
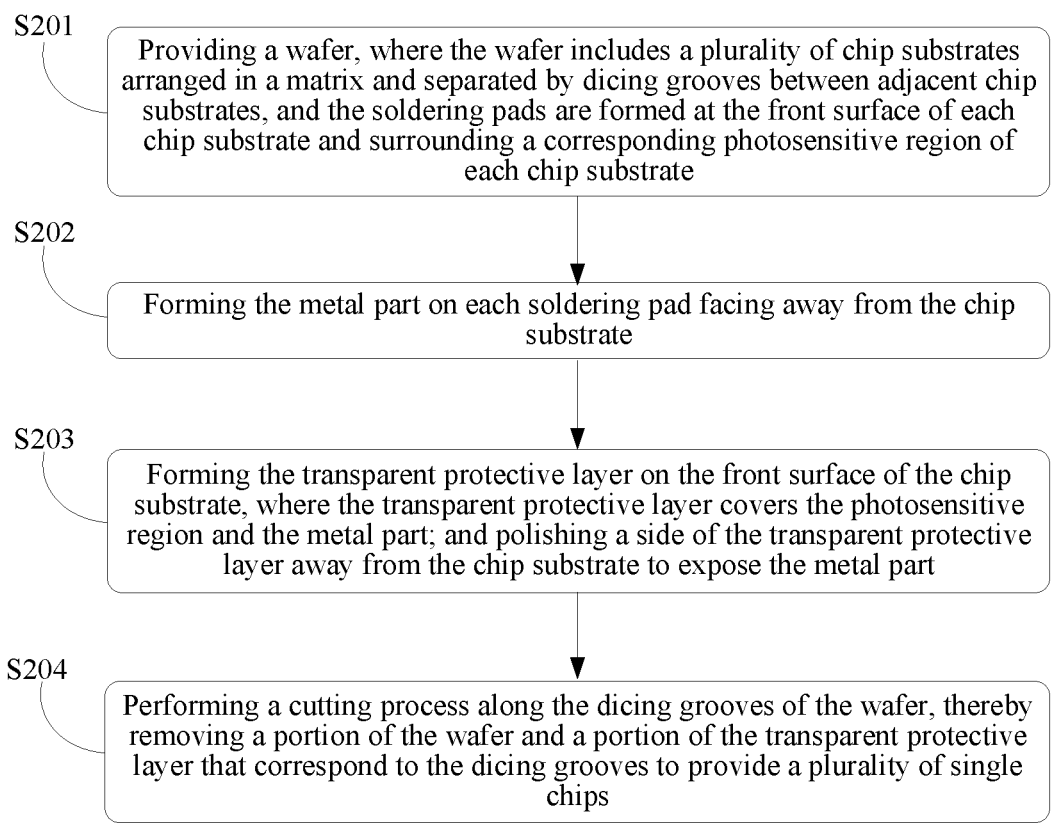
FIG. 2 illustrates a schematic flowchart of performing S101 in FIG. 1 according to various embodiments of the present disclosure.

In one embodiment, referring to FIGS. 2 and 3A-3D, FIG. 2 illustrates a schematic flowchart of performing S101 in FIG. 1 according to various embodiments of the present disclosure; and FIGS. 3A-3D illustrate structural schematics of an exemplary package device corresponding to S201-S204 in FIG. 2 according to various embodiments of the present disclosure. The above-mentioned S101 may include, for example, the following exemplary steps.

In S201, a wafer 1 may be provided, where the wafer 1 may include a plurality of chip substrates 10 arranged in a matrix; dicing grooves 12 may be disposed between the chip substrates 10; the wafer 1 may include a front surface 14 and a back surface 16; the front surface 14 of the chip substrate 10 may be the front surface 14 of the wafer 1, and the back surface 16 of the chip substrate 10 may be the back surface 16 of the wafer 1; the front surface 14 of the chip substrate 10 may include a photosensitive region 100 and be disposed with soldering pads 102 surrounding the photosensitive region 100; and the above-mentioned structure may be shown in FIG. 3A.

In S202, a metal part 18 may be formed on the side of each soldering pad 102 facing away from the chip substrate 10.

For example, referring to FIG. 3B, in an application case, the metal part 18 may be a protruded metal column. The above-mentioned S202 may include forming the protruded metal column on the side of the soldering pad 102 facing away from the chip substrate 10 using an electroplating process. The electroplating process may include partial electroplating, composite electroplating, pulse electroplating, electroforming, mechanical plating, and the like. The protruded metal column may be made of a conductive metal material including nickel, chromium, copper, zinc, cadmium, alloy, and/or any other suitable material(s), which may not be limited according to various embodiments of the present application.

In another application case, the metal part 18 may be a protruded metal point. The above-mentioned S202 may include forming the protruded metal point on the side of the soldering pad 102 facing away from the chip substrate 10 using a bonding process. The material of the metal points may be gold, copper, and the like. The height of the protruded metal point formed by the bonding process may be less than the height of the protruded metal column formed by the electroplating process.

In S203, a transparent protective layer 11 may be formed on the front surface 14 of the chip substrate 10; the transparent protective layer 11 may cover the photosensitive region 100 and the metal part 18; a first end 180 of the metal part 18 away from the soldering pad 102 may be in coplanar with the transparent protective layer 11; and the surface of the first end 180 of the metal part 18 may be exposed or uncovered by the transparent protective layer 11 after polishing at least a portion of the side of the transparent protective layer 11 away from the chip substrate 10.

For example, referring to FIG. 3C, in an application case, forming the transparent protective layer 11 may be: forming the transparent protective layer 11 on the front surface 14 of the chip substrate 10 by spin coating, dispensing or printing a material, and solidifying the material of the transparent protective layer 11. The thickness of the formed transparent protective layer 11 may be at the micron level. Compared with the conventional manner of disposing transparent glass, the thickness of the transparent protective layer 11 may be less than the thickness of the transparent glass, and the light refraction, reflection, and energy loss may be reduced, thereby improving the photosensitive effect of the chip. The material of the transparent protective layer 11 may be an inorganic transparent material such as silicon nitride, silicon oxynitride and the like, or an organic transparent material such as polysiloxane. Furthermore, the manner for solidifying the transparent protective layer 11 may be ultraviolet irradiation or high-temperature baking. The used manner may be determined according to an initiator added to prepare the transparent protective layer 11. If the initiator is a photo-initiator (e.g., 2-hydroxy-2-methyl-1-phenylacetone, 1-hydroxycyclohexylphenyl ketone and the like), an ultraviolet radiation manner may be used; and if the initiator is a thermal initiator (e.g., benzoyl peroxide and the like), a high-temperature baking manner may be used.

In an application case, the above-mentioned S203 may, for example, include forming the transparent protective layer 11 on the front surface 14 of the chip substrate 10, where the transparent protective layer 11 may cover the surface of the first end 180 of the metal part 18. At this point, the height between the transparent protective layer 11 and the front surface 14 of the chip substrate 10 may be greater than the height between the surface of the first end 180 of the metal part 18 and the front surface 14 of the chip substrate 10. The side of the transparent protective layer 11 away from the chip substrate 10 may be polished to expose the first end 180 of the metal part 18. In one embodiment, a substrate may first be fixed on the back surface 16 of the wafer 1 shown in FIG. 3C using an adhesive film before the polishing treatment; the state of the wafer 1 may then be configured, such that the front surface 14 of the wafer 1 is located at a lower side; and the transparent protective layer 11 may be polished to expose the first end 180 of the metal part 18. The polishing stop timing may be configured according to actual situations, which may not be limited according to various embodiments in the present application. For example, the polishing may be stopped when the first ends 180 of all of the metal parts 18 are exposed. For another example, after the first ends 180 of all of the metal parts 18 are exposed, the polishing may be continued for a first preset distance before the polishing is stopped.

In another application case, the above-mentioned S203 may be performed using other manners. For example, a protective part may be introduced, and the height formed by the transparent protective layer 11 may be controlled by the protective part. The protective part may be disposed by covering on the front surface 14 of the chip substrate 10, and the first end 180 of the metal part 18 may be abutted against the protective part; and the protective part may also be disposed with a liquid inlet, and the liquid of the transparent protective layer 11 may enter from the liquid inlet.

In S204, a cutting process may be performed along the dicing grooves 12 of the wafer, thereby removing a portion of the wafer 1 and a portion of the transparent protective layer 11 that correspond to the dicing grooves 12 to provide a plurality of single chips.

For example, in an application case, as shown in FIG. 3D, the wafer 1 and the transparent protective layer 11 corresponding to the dicing grooves 12 may be cut by a cutting manner such as plasma to obtain the single chips.

In S102, a conductive connection part may be used to electrically connect the first end of the metal part with a circuit board, such that the chip may be electrically connected to the circuit board.

For example, in an application case, in order to avoid loosening or relative position change between the chip and the circuit board during the connecting process of the conductive connection part, before the above-mentioned S102, the packaging method provided in the present application may further include fixing the back surface of the chip substrate with the circuit board. In one embodiment, the above-mentioned method for fixing the back surface of the chip substrate with the circuit board may include fixing the back surface of the chip substrate with the circuit board with an adhesive film. The adhesive film may be an adhesive object such as a double-sided adhesive. In other embodiments, other fixing manners may also be used, which may not be limited according to various embodiments of the present disclosure.

In another application case, referring to FIG. 4, FIG. 4 illustrates a structural schematic of an exemplary package device according to various embodiments of the present disclosure. A conductive connection part 13 may be a wire; and the above-mentioned S102 may be, for example, using the wire to electrically connect the first end 180 of the metal part 18 with the circuit board 15. One end of the wire may be electrically connected to the first end 180 of the metal part 18, and the other end of the wire may be electrically connected to a preset position of the circuit board 15. The electrical connection manner may include reflow soldering or the like. The chip may transmit signals to the circuit board 15 through the wire, or the chip may receive signals transmitted by the circuit board 15 through the wire. The material of the wire may be any one or a combination of gold, aluminum, copper, copper-iron, copper-nickel-silicon, copper-chromium, and copper-nickel-tin alloys, as long as the wire has conductive function, desirable mechanical strength, and anti-stress relaxation property.

Furthermore, in one embodiment, the wire may be electrically connected to the first end 180 of the metal part 18, directly. For example, a layer of solder may be coated on the surface of the first end 180, and then the wire may be fixedly connected to the first end 180 by a reflow manner. Similarly, a layer of solder may be coated on a preset position of the circuit board 15 and then the other end of the wire may be fixedly connected to the preset position of the circuit board 15 by a reflow manner. Or, a solder ball mounting machine may be used to mount the solder ball on the first end 180 of the metal part 18, and the wire may be used to electrically connect the solder ball, such that one end of the wire may be electrically connected to the metal part 18. Similarly, the solder ball may also be placed at a preset position on the circuit board 15, and then the other end of the wire may be fixedly connected to the solder ball at the preset position on the circuit board 15 by a reflow manner.

In another embodiment, different from FIG. 4, the height d1 between the first end 180 of the metal part 18 and the front surface 14 of the chip substrate 10 may be greater than the height d2 between the transparent protective layer 11 and the front surface 14 of the chip substrate 10; and the metal part may be a protruded metal column. In order to reduce the shaking probability between the chip substrate 10 and the circuit board 15, the package device provided in one embodiment may further include an adhesive film (not shown in FIG. 4) located between the back surface 16 of the chip substrate 10 and the circuit board 15.

In still another embodiment, different from FIG. 4, the height d1 between the first end 180 of the metal part 18 and the front surface 14 of the chip substrate 10 may be less than the height d2 between the transparent protective layer 11 and the front surface 14 of the chip substrate 10; and an opening may be disposed at the position of the transparent protective layer 11 corresponding to the metal part 18. In such way, the first end 180 of the metal part 18 may be exposed from the transparent protective layer 11, and the metal part 18 may be a protruded metal column or a protruded metal point. For example, a wire may be connected to the first end 180 of the metal part 18 through the opening. A solder ball may be disposed at the surface of the first end 180 of the metal part 18 exposed from the transparent protective layer 11. For example, the solder ball may be disposed inside the opening, and a wire may be connected to the solder ball, thereby connecting the wire to the first end 180 of the metal part 18.

Figure 5:
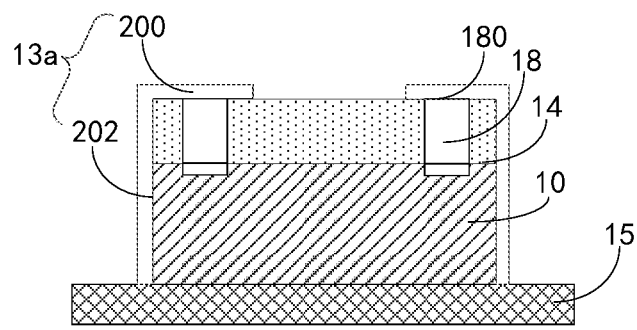
FIG. 5 illustrates a structural schematic of another exemplary package device according to various embodiments of the present disclosure.

In another application case, referring to FIG. 5, FIG. 5 illustrates a structural schematic of another exemplary package device according to various embodiments of the present disclosure. A conductive connection part 13a in the semiconductor package device provided by the present application may be a conductive folded plate; and the first end 180 of the metal part 18 and the circuit board 15 may be electrically connected with each other by the conductive folded plate. In one embodiment, the folded plate may include a first portion 200 and a second portion 202; one end of the first portion 200 may be connected to one end of the second portion 202; the first portion 200 may be in parallel with the front surface 14 of the chip substrate 10, and the first portion 200 may extend along a direction toward the chip substrate 10; and the second portion 202 may be in parallel with the sidewall of the chip, and the second portion 202 may be disposed in a close proximity to the sidewall of the chip.

In another embodiment, different from FIG. 5, the height d1 between the first end 180 of the metal part 18 and the front surface 14 of the chip substrate 10 may be greater than the height d2 between the transparent protective layer 11 and the front surface 14 of the chip substrate 10. The first end 180 of the metal part 18 may be exposed by protruding from the transparent protective layer 11, and the metal part 18 may be a protruded metal column or a protruded metal point.

In still another embodiment, different from FIG. 5, the height d1 between the first end 180 of the metal part 18 and the front surface 14 of the chip substrate 10 may be less than the height d2 between the transparent protective layer 11 and the front surface 14 of the chip substrate 10; and an opening may be disposed at the position of the transparent protective layer 11 corresponding to the metal part 18. In such way, the first end 180 of the metal part 18 may be exposed from the transparent protective layer 11, and the metal part 18 may be a protruded metal column or a protruded metal point. A solder ball may be disposed on the surface of the first end 180 of the metal part 18 exposed from the transparent protective layer 11, and one end of the solder ball may be protruding from the transparent protective layer 11. The conductive connection part 13a may be connected to the solder ball, thereby connecting the conductive connection part 13a to the first end 180 of the metal part 18.

Figure 6:
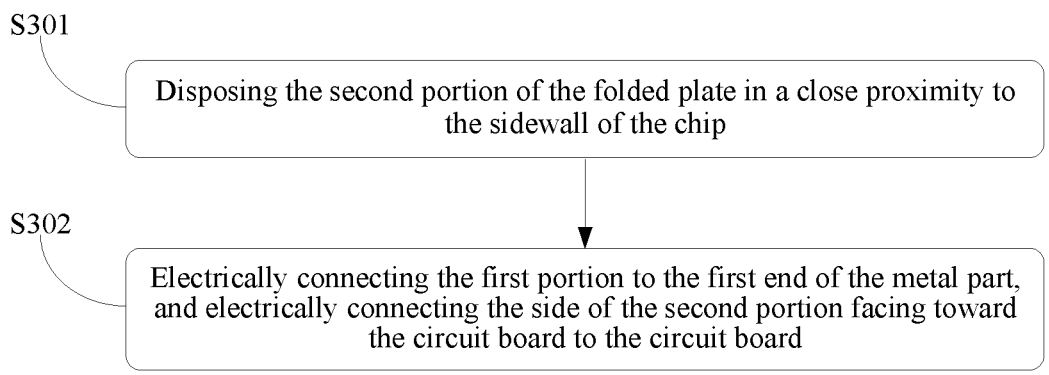
FIG. 6 illustrates a schematic flowchart of performing S102 in FIG. 1 according to various embodiments of the present disclosure.

Referring to FIG. 6, FIG. 6 illustrates a schematic flowchart of performing S102 in FIG. 1 according to various embodiments of the present disclosure. The above-mentioned S102 may, for example, include:

S301, disposing the second portion 202 of the folded plate in a close proximity to the sidewall of the chip; and S302, electrically connecting the first portion 200 to the first end 180 of the metal part 18, and electrically connecting the side of the second portion 202 facing toward the circuit board 15 to the circuit board 15.

In one embodiment, as shown in FIG. 5, a layer of solder may be first coated on the first portion 200 or the first end 180 of the metal part 18, and/or a layer of solder may be first coated on the side of the second portion 202 which is in contact with the circuit board 15 or on the position where the circuit board 15 is in contact with the second portion 202, and then a reflowing treatment may be performed on the above-mentioned entire structure, thereby electrically connecting the first portion 200 to the first end 180 of the metal part 18, and electrically connecting the side of the second portion 202 facing toward the circuit board 15 to the circuit board 15.

In other embodiments, other manners may also be performed. For example, the solder ball may be first mounted on the first end 180 of the metal part 18, and/or the solder ball may be mounted at the position where the circuit board 15 is in contact with the second portion 202, and then a reflowing treatment may be performed on the above-mentioned entire structure, thereby electrically connecting the first portion 200 to the first end 180 of the metal part 18, and electrically connecting the side of the second portion 202 facing toward the circuit board 15 to the circuit board 15.

Figure 7:
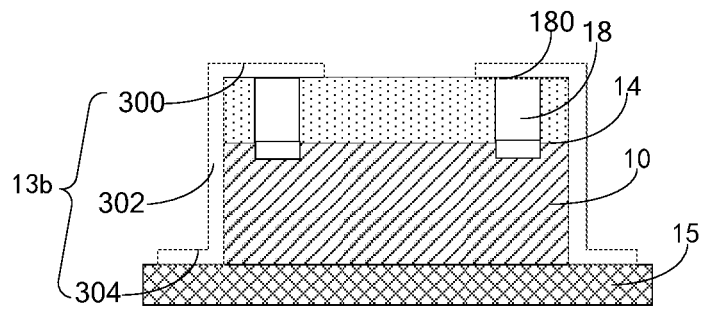
FIG. 7 illustrates a structural schematic of another exemplary package device according to various embodiments of the present disclosure.

In another application case, referring to FIG. 7, FIG. 7 illustrates a structural schematic of another exemplary package device according to various embodiments of the present disclosure. In the semiconductor package device provided in the present application, a conductive connection part 13b may be a conductive folded plate, and the conductive folded plate may be used to electrically connect the first end 180 of the metal part 18 with the circuit board 15. In one embodiment, the folded plate may include a first portion 300, a second portion 302, and a third portion 304. Two ends of the second portion 302 may be respectively connected to the first portion 300 and the third portion 304; the first portion 300 may be in parallel with the front surface 14 of the chip substrate 10, and the first portion 300 may extend along a direction toward the chip substrate 10. The second portion 302 may be in parallel with the sidewall of the chip, and the second portion 302 may be disposed in a close proximity to the sidewall of the chip. The third portion 304 may extend away from the chip; the third portion 304 may be in parallel with the surface of the circuit board 15; the first portion 300 may be electrically connected to the first end 180 of the metal part 18; and the side of the third portion 304 facing toward the circuit board 15 may be electrically connected to the circuit board 15.

In another embodiment, different from FIG. 7, the height d1 between the first end 180 of the metal part 18 and the front surface 14 of the chip substrate 10 may be greater than the height d2 between the transparent protective layer 11 and the front surface 14 of the chip substrate 10. The first end 180 of the metal part 18 may be exposed by protruding from the transparent protective layer 11, and the metal part 18 may be a protruded metal column or a protruded metal point.

In still another embodiment, different from FIG. 7, the height d1 between the first end 180 of the metal part 18 and the front surface 14 of the chip substrate 10 may be less than the height d2 between the transparent protective layer 11 and the front surface 14 of the chip substrate 10; and an opening may be disposed at the position of the transparent protective layer 11 corresponding to the metal part 18. In such way, the first end 180 of the metal part 18 may be exposed from the transparent protective layer 11, and the metal part 18 may be a protruded metal column or a protruded metal point. A solder ball may be disposed on the surface of the first end 180 of the metal part 18 exposed from the transparent protective layer 11, and one end of the solder ball may be protruding from the transparent protective layer 11. The conductive connection part 13a may be connected to the solder ball, thereby connecting the conductive connection part 13a to the first end 180 of the metal part 18.

Figure 8:
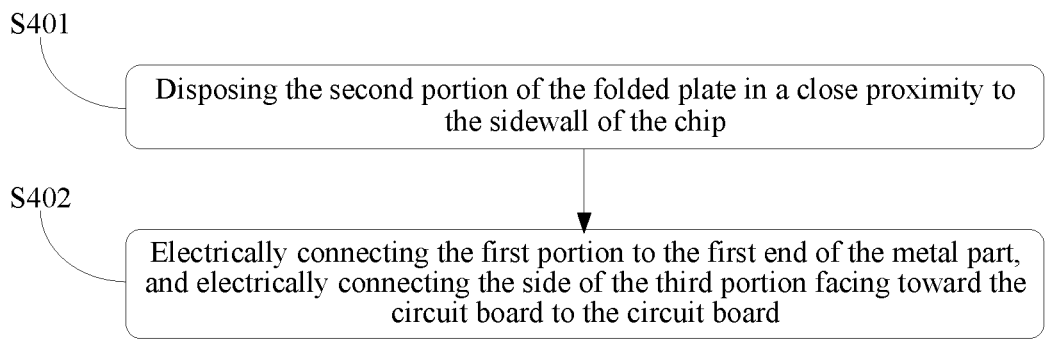
FIG. 8 illustrates a schematic flowchart of performing S102 in FIG. 1 according to various embodiments of the present disclosure.

Referring to FIG. 8, FIG. 8 illustrates another schematic flowchart of performing S102 in FIG. 1 according to various embodiments of the present disclosure. The above-mentioned S102 may, for example, include:

S401, disposing the second portion 302 of the folded plate in a close proximity to the sidewall of the chip; and S402, electrically connecting the first portion 300 to the first end 180 of the metal part 18, and electrically connecting the side of the third portion 304 facing toward the circuit board 15 to the circuit board 15.

In one embodiment, as shown in FIG. 7, a layer of solder may be first coated on the first portion 300 or the first end 180 of the metal part 18, and/or a layer of solder may be first coated on the side of the third portion 304 which is in contact with the circuit board 15 or the position where the circuit board 15 is in contact with the third portion 304, and then a reflowing treatment may be performed on the above-mentioned entire structure, thereby electrically connecting the first portion 300 to the first end 180 of the metal part 18, and electrically connecting the side of the third portion 304 facing the circuit board 15 to the circuit board 15.

In other embodiments, other manners may also be performed. For example, the solder ball may be first mounted on the first end 180 of the metal part 18, and/or the solder ball may be mounted at the position where the circuit board 15 is in contact with the third portion 304, and then a reflowing treatment may be performed on the above-mentioned entire structure, thereby electrically connecting the first portion 300 to the first end 180 of the metal part 18, and electrically connecting the side of the third portion 304 facing the circuit board 15 to the circuit board 15.

In the present application, the above-mentioned folded plate may be made of an all-metal material, for example, FPC (flexible circuit board) and the like; or the folded plate may include a metal material and an insulation material surrounding the metal material. The metal material may be equivalent to metal wires, and the surrounding insulation material may be equivalent to a frame structure.

Different from the existing technology, in the packaging method provided by the present application, the transparent protective layer may be directly formed on the front surface of the chip substrate. On the one hand, the method may be used to control the thickness of the transparent protective layer; compared with the conventional manner of disposing transparent glass, the thickness of the transparent protective layer may be less than the thickness of transparent glass, which may reduce light refraction, reflection and energy loss, and improve the photosensitive effect of the chip. On the other hand, since the transparent protective layer is directly formed on the front surface of the chip substrate, the probability of the transparent protective layer being separated from the front surface of the chip may be low, and the dust-free requirement of the usage environment may be further reduced.

The semiconductor package device prepared by the above-mentioned semiconductor package method may be further described hereinafter.

Referring to FIG. 4, the semiconductor package device may include the chip substrate 10, where the chip substrate 10 may include the front surface 14 and the back surface 16; the front surface 14 of the chip substrate 10 may include the photosensitive region 100 and be disposed with the soldering pads 102 surrounding the photosensitive region 100. For example, the chip may be obtained by cutting the wafer. The quantity of soldering pads 102 may be multiple, for example 2, 4, and the like. In one embodiment, the soldering pads 102 may be equivalent to be embedded into the front surface 14 of the chip substrate 10.

The semiconductor package device may further include the metal part 18 formed on the side of the soldering pad 102 facing away from the chip 10. For example, in an application case, the metal part 18 may be a protruded metal point or a protruded metal column. When the metal part 18 is a protruded metal point, the metal part 18 may be formed by a bonding process, and the material of the protruded metal point may be gold and the like. When the metal part 18 is a protruded metal column, the metal part 18 may be formed by an electroplating process. The electroplating process may include partial electroplating, composite electroplating, pulse electroplating, electroforming, mechanical plating, and the like. The protruded metal column may be made of a conductive metal material including nickel, chromium, copper, zinc, cadmium, alloy, and/or any other suitable material(s), which may not be limited according to various embodiments of the present application.

The semiconductor package device may further include the transparent protective layer 11 which is at the front surface 14 of the chip substrate 10 and covers the photosensitive region 100 of the chip substrate 10. The first end 180 of the metal part 18 away from the chip substrate 10 may be in coplanar with the transparent protective layer 11; and the first end 180 of the metal part 18 may not be covered by the transparent protective layer 11. That is, in one embodiment, the height d1 between the first end 180 of the metal part 18 and the front surface 14 of the chip substrate 10 may be equal to the height d2 between the transparent protective layer 11 and the front surface 14 of the chip substrate 10. For example, in an application case, the transparent protective layer 11 may be formed by spin coating, dispensing or printing manners. The thickness of the transparent protective layer 11 formed by the above-mentioned manners may be in the micron level. Compared with the conventional manner of disposing transparent glass, the thickness of the transparent protective layer 11 may be less than the thickness of the transparent glass, and the light refraction, reflection, and energy loss may be reduced, thereby improving the photosensitive effect of the chip. The material of the transparent protective layer 11 may be an inorganic transparent material such as silicon nitride, silicon oxynitride and the like, or an organic transparent material such as polysiloxane. Furthermore, the manner for solidifying the transparent protective layer 11 may be ultraviolet irradiation or high-temperature baking. The used manner may be determined according to an initiator added to prepare the transparent protective layer 11. If the initiator is a photo-initiator (e.g., 2-hydroxy-2-methyl-1-phenylacetone, 1-hydroxycyclohexylphenyl ketone and the like), an ultraviolet radiation manner may be used; and if the initiator is a thermal initiator (e.g., benzoyl peroxide and the like), a high-temperature baking manner may be used.

The semiconductor package device may further include the circuit board 15 located on the back surface 16 of the chip substrate 10.

The semiconductor package device may further include the conductive connection part 13 which may electrically connect the surface of the first end 180 of the metal part 18, exposed by protruding over the surface of the transparent protective layer 11, with the circuit board 15, where the chip substrate 10 and the circuit board 15 may be electrically connected with each other.

In exemplary embodiment one as shown in FIG. 4, the conductive connection part 13 in the semiconductor package device may be a wire. The material of the wire may be any one or a combination of gold, aluminum, copper, copper-iron, copper-nickel-silicon, copper-chromium, and copper-nickel-tin alloys, as long as the wire has conductive function, desirable mechanical strength, and anti-stress relaxation property.

In one embodiment, in order to reduce the shaking probability between the chip substrate 10 and the circuit board 15, the package device provided in one embodiment may further include an adhesive film (not shown in FIG. 4) located between the back surface 16 of the chip substrate 10 and the circuit board 15.

In exemplary embodiment two as shown in FIG. 5, the difference between exemplary embodiment two and exemplary embodiment one is: the conductive connection part 13a may be the conductive folded plate; the folded plate may include the first portion 200 and the second portion 202; the first portion 200 may be in parallel with the front surface 14 of the chip substrate 10 and extend along the direction toward the chip substrate 10; and the second portion 202 may be in parallel with the sidewall of the chip and disposed in a close proximity to the sidewall of the chip. The first portion 200 may be electrically connected to the first end 180 of the metal part 18, and the side of the second portion 202 facing toward the circuit board 15 may be electrically connected to the circuit board 15. In one embodiment, the folded plate may be made of an all-metal material; or the folded plate may include a metal material and an insulation material surrounding the metal material. The metal material may be equivalent to metal wires, and the surrounding insulation material may be equivalent to a frame structure.

In exemplary embodiment three as shown in FIG. 7, the difference between exemplary embodiment three and exemplary embodiment one is: the conductive connection part 13b may be a conductive folded plate; the folded plate may include the first portion 300, the second portion 302, and the third portion 304, where the first portion 300 may be connected to the third portion 304 through the second portion 302; the first portion 300 may be in parallel with the front surface 14 of the chip substrate 10 and extend along the direction toward the chip 10; the second portion 302 may be in parallel with the sidewall of the chip and disposed in a close proximity to the sidewall of the chip; the third portion 304 may extend away from the chip 10; the third portion 304 may be in parallel with the surface of the circuit board 15; the first portion 300 may be electrically connected to the first end 180 of the metal part 18; and the side of the third portion 304 facing toward the circuit board 15 may be electrically connected to the circuit board 15. In one embodiment, the folded plate may be made of an all-metal material; or the folded plate may include a metal material and an insulation material surrounding the metal material.

Compared with the conventional technology, the technical solutions of various embodiments provided by the present disclosure may have the following beneficial effects.

Different from the existing technology, in the packaging method provided by the present application, the transparent protective layer may be directly formed on the front surface of the chip substrate. On the one hand, the method may be used to control the thickness of the transparent protective layer; compared with the conventional manner of disposing transparent glass, the thickness of the transparent protective layer may be less than the thickness of transparent glass, which may reduce light refraction, reflection and energy loss, and improve the photosensitive effect of the chip. On the other hand, since the transparent protective layer is directly formed on the front of the chip substrate, the probability of the transparent protective layer being separated from the front surface of the chip substrate may be low, and the dust-free requirement of the usage environment may be further reduced.

Various embodiments of the present application may be described above, which may not limit the patent scope of the present application. Any equivalent structure or equivalent process transformation made using the contents of the description and drawings of the present application or directly or indirectly applied to other related technical fields may be included in the patent protection scope of the present application.

What is claimed is:

1. A semiconductor package device, comprising:
   a chip comprising:
     a chip substrate having a front surface and a back surface, wherein the front surface includes a photosensitive region;
     soldering pads disposed at the front surface of the chip substrate surrounding the photosensitive region;
     a metal part formed on a side of each soldering pad facing away from the chip substrate; and
     a transparent protective layer formed on the front surface of the chip substrate, wherein the transparent protective layer covers the photosensitive region of the chip substrate;
   a circuit board, on the back surface of the chip substrate; and
   a conductive connection part including a first portion and a second portion, wherein
   the first portion is in parallel with the front surface of the chip substrate and electrically connects to the metal part,
   the second portion is disposed on a sidewall of the transparent protective layer and on a sidewall of the chip substrate, and an end part of the second portion is physically and electrically connected to the circuit board, and
   the chip and the circuit board are electrically connected with each other.

2. The device according to claim 1, wherein:
the transparent protective layer is formed by spin coating, dispensing, or printing a material.

3. The device according to claim 2, wherein:
the transparent protective layer is a material after solidifying the material for the transparent protective layer using ultraviolet irradiation or high-temperature baking.

4. The device according to claim 1, wherein:
an end of the metal part away from a corresponding soldering pad is coplanar with the transparent protective layer and not covered by the transparent protective layer.

5. The device according to claim 1, wherein:
the second portion of the conductive connection part is disposed in a close proximity to the sidewall of the chip.

6. The device according to claim 1, wherein:
the conductive connection part further includes a third portion, wherein the first portion is connected to the third portion through the second portion; the third portion extends along a direction away from the chip; the third portion is in parallel with a surface of the circuit board with an end connected to the end part of the second portion.

7. The device according to claim 1, wherein:
the conductive connection part is made of an all-metal material or a material including a metal material and an insulation material surrounding the metal material.

8. The device according to claim 1, wherein:
the second portion of the conductive connection part is in parallel with the sidewall of the transparent protective layer and the sidewall of the chip substrate.

9. The device according to claim 1, wherein:
the metal part is a protruded metal column that protrudes over a surface of the transparent protective layer, and
the first portion of the conductive connection part is electrically connected to a surface of the protruded metal column facing away from the chip substrate.

10. The device according to claim 1, further including:
an adhesive film, between the back surface of the chip substrate and the circuit board, and
the second portion of the conductive connection part is further in parallel with a sidewall of the adhesive film.

* * * * *